(12) United States Patent
Hirano

(10) Patent No.: US 12,453,236 B2
(45) Date of Patent: Oct. 21, 2025

(54) LIGHT EMITTING DISPLAY DEVICE WITH A TANDEM EMISSION PART

(71) Applicant: LG Display Co., Ltd., Seoul (KR)

(72) Inventor: Takashi Hirano, Paju-si (KR)

(73) Assignee: LG DISPLAY CO., LTD., Seoul (KR)

(*) Notice: Subject to any disclaimer, the term of this patent is extended or adjusted under 35 U.S.C. 154(b) by 544 days.

(21) Appl. No.: 17/977,995

(22) Filed: Oct. 31, 2022

(65) Prior Publication Data

US 2023/0217678 A1 Jul. 6, 2023

(30) Foreign Application Priority Data

Dec. 30, 2021 (KR) .................. 10-2021-0192298

(51) Int. Cl.
| | |
|---|---|
| *H10K 50/19* | (2023.01) |
| *H10K 59/122* | (2023.01) |
| *H10K 59/35* | (2023.01) |
| *H10K 71/00* | (2023.01) |
| *H10K 59/12* | (2023.01) |

(52) U.S. Cl.
CPC .......... *H10K 50/19* (2023.02); *H10K 59/122* (2023.02); *H10K 59/351* (2023.02); *H10K 71/00* (2023.02); *H10K 59/1201* (2023.02)

(58) Field of Classification Search
CPC ...................................................... H10K 50/19
USPC ................................................................ 257/40
See application file for complete search history.

(56) References Cited

U.S. PATENT DOCUMENTS

2020/0043987 A1* 2/2020 Son .................. H10K 50/82
2021/0351247 A1* 11/2021 Hack ................. H10K 59/351

FOREIGN PATENT DOCUMENTS

KR 10-2021-0076759 A 6/2021

* cited by examiner

*Primary Examiner* — Ajay Arora
(74) *Attorney, Agent, or Firm* — Birch, Stewart, Kolasch & Birch, LLP

(57) ABSTRACT

A light emitting display device can include a light emitting diode structure disposed on a substrate and having a first sub-pixel, a second sub-pixel, a third sub-pixel and a fourth sub-pixel, a bank that defines a pixel area of each of the first sub-pixel, the second sub-pixel, the third sub-pixel and the fourth sub-pixel, and a function improving unit disposed on the first emission part, the second emission part, the third emission part, the fourth emission part and the bank. One or two of sub-pixel among the first to fourth sub-pixels include a tandem emission part in which a first emission unit including a first emission layer and a second emission unit disposed on the first emission unit and including a second emission part are laminated.

17 Claims, 12 Drawing Sheets

LIGHT EMITTING DISPLAY DEVICE WITH A TANDEM EMISSION PART

CROSS-REFERENCE TO RELATED APPLICATIONS

This application claims priority to Korean Patent Application No. 10-2021-0192298 filed on Dec. 30, 2021 in the Republic of Korea, the entire contents of which are hereby expressly incorporated by reference into the present application.

BACKGROUND

Field

The present disclosure relates to a light emitting display device, and more particularly, to a light emitting display device with improved power consumption and an increased lifespan of a blue pixel.

Description of the Related Art

As the world entered the information age, the field of display devices for visually displaying electrical information signals has grown rapidly. Thus, studies for improving performance, such as thinner profile, lighter weight, and lower power consumption, of various display devices, have continued.

Among these various display devices, a light emitting display device is a self-light emitting display device and can be manufactured to be light and thin since it does not require a separate light source, unlike a liquid crystal display device.

Also, the light emitting display device has advantages in terms of power consumption due to a low voltage driving, and is excellent in terms of a color implementation, a response speed, a viewing angle and a contrast ratio (CR). Therefore, light emitting display devices are expected to be utilized in various fields.

As a display of high resolution has been developed, the number of pixels per unit area has been increased and a high luminance is needed. However, there is a limitation in current per unit area due to an emission structure of a light emitting display device. Also, the reliability of a light emitting diode can be degraded and the power consumption can be increased due to an increase in applied current.

Therefore, to overcome a technical limitation which is a factor that can degrade the quality and productivity of the light emitting display device, it is needed to improve luminous efficiency and a lifespan of the light emitting diode and reduce power consumption.

In this respect, various studies for developing a light emitting diode, which can improve luminous efficiency, a lifespan of an emission layer and a viewing angle while maintaining a color area, have been made.

SUMMARY OF THE DISCLOSURE

An object to be achieved by the present disclosure is to provide a light emitting display device in which power consumption can be improved and a lifespan of a blue pixel can be increased by improving the structure of a light emitting diode.

Another object to be achieved by the present disclosure is to provide a light emitting display device of which manufacturing costs can be reduced by forming a light emitting diode through a solution process.

Objects of the present disclosure are not limited to the above-mentioned objects, and other objects, which are not mentioned above, can be clearly understood by those skilled in the art from the following descriptions.

According to an aspect of the present disclosure, the light emitting display device includes a substrate. Also, the light emitting display device includes a light emitting diode structure disposed on the substrate and having a first sub-pixel including a first emission part that emits light of a first color, a second sub-pixel including a second emission part that emits light of a second color, a third sub-pixel including a third emission part that emits light of a third color and a fourth sub-pixel including a fourth emission part that emits light of a fourth color. Further, the light emitting display device includes a bank that defines a pixel area of each of the first sub-pixel, the second sub-pixel, the third sub-pixel and the fourth sub-pixel. Furthermore, the light emitting display device includes a function improving unit disposed on the first emission part, the second emission part, the third emission part, the fourth emission part and the bank. One or two of sub-pixel among the first to fourth sub-pixels include a tandem emission part in which a first emission unit including a first emission layer and a second emission unit disposed on the first emission unit and including a second emission part are laminated.

Other detailed matters of the exemplary embodiments are included in the detailed description and the drawings.

According to the present disclosure, in a light emitting display device that emits red light, green light and blue light, a function improving unit is formed in each sub-pixel. Also, a blue sub-pixel has a tandem structure including a first emission unit and a second emission unit. Thus, it is possible to improve a lifespan of the blue sub-pixel.

According to the present disclosure, a sub-pixel that emits white light is formed in a tandem manner in each of sub-pixels that emit red light, green light, blue light and white light, respectively. Also, a function improving unit is disposed in each of the sub-pixels. Thus, it is possible to improve power consumption efficiency of the white sub-pixel.

According to the present disclosure, a sub-pixel that emits blue light and a sub-pixel that emits white light are formed in a tandem manner in each of sub-pixels that emit red light, green light, blue light, and white light, respectively. Also, a function improving unit is disposed in each of the sub-pixels. Thus, it is possible to improve power consumption efficiency of the white sub-pixel and also possible to minimize a decrease in lifespan of the blue sub-pixel.

According to the present disclosure, hydrophobic treatment is performed onto a surface of a bank for defining a tandem structure sub-pixel area. Also, a tandem structure sub-pixel is formed through a solution process. Thus, it is possible to reduce manufacturing costs.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENTS

Figure 1:
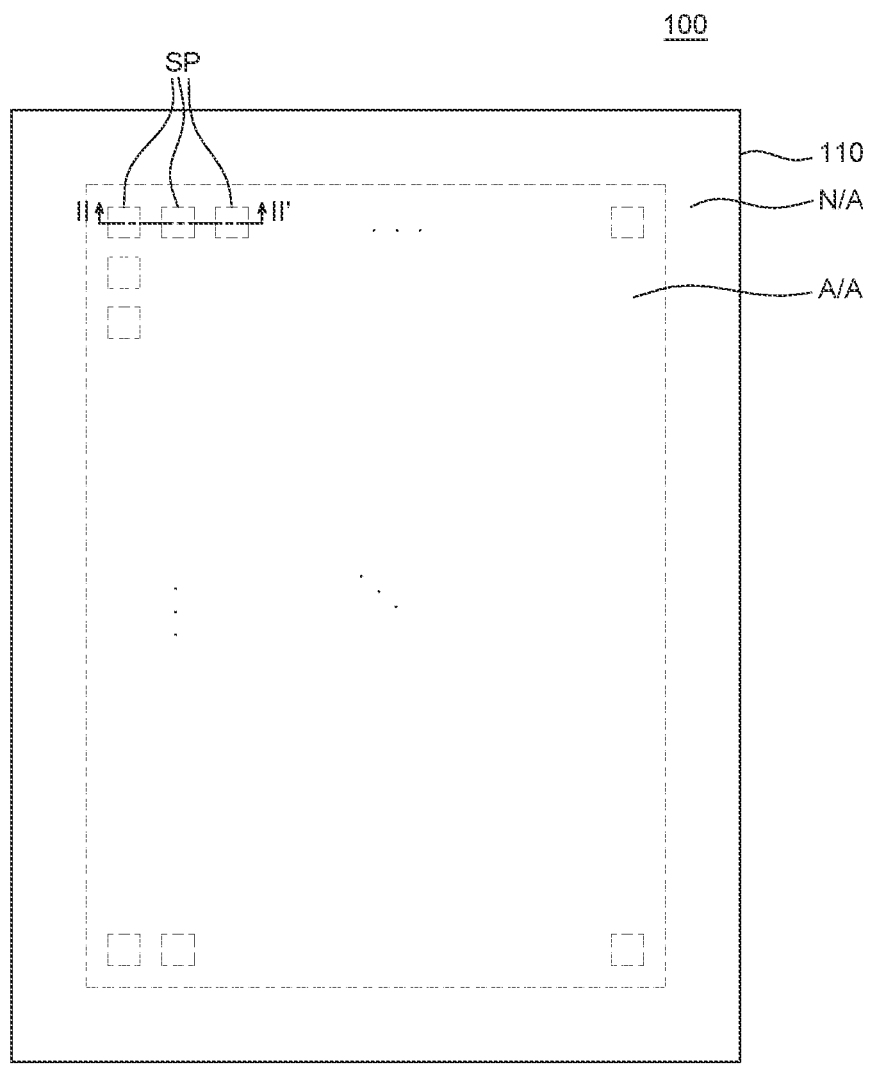
FIG. 1 is a plan view of a light emitting display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies can be omitted to avoid unnecessarily obscuring the subject matter of the present disclosure. The terms such as "including," "having," and "consist of" used herein are generally intended to allow other components to be added unless the terms are used with the term "only". Any references to singular can include plural unless expressly stated otherwise.

Components are interpreted to include an ordinary error range even if not expressly stated.

When the position relation between two parts is described using the terms such as "on", "above", "below", and "next", one or more parts can be positioned between the two parts unless the terms are used with the term "immediately" or "directly".

When an element or layer is disposed "on" another element or layer, another layer or another element can be interposed directly on the other element or therebetween.

Although the terms "first", "second", and the like are used for describing various components, these components are not confined by these terms. These terms are merely used for distinguishing one component from the other components. Therefore, a first component to be mentioned below can be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, various exemplary embodiments of the present disclosure will be described in detail with reference to the accompanying drawings. All the components of each light emitting display device according to all embodiments of the present disclosure are operatively coupled and configured.

FIG. 1 is a plan view of a light emitting display device according to an exemplary embodiment of the present disclosure.

Referring to FIG. 1, in a light emitting display device 100 according to an exemplary embodiment of the present disclosure, a plurality of sub-pixels SP is disposed on a substrate 110.

The substrate 110 serves to support and protect various components of the light emitting display device 100. The substrate 110 can be made of glass or a plastic material having flexibility. If the substrate 110 is made of a plastic material, it can be made of, for example, polyimide, but is not limited thereto.

The substrate 110 includes a display area A/A and a non-display area N/A.

The display area A/A is an area where an image is displayed in the light emitting display device 100. In the display area A/A, a plurality of pixels serving as display elements and various driving elements for driving the display elements can be disposed. For example, each of the pixels serving as display elements can include a light emitting diode including a first electrode, an emission layer and a second electrode. Also, various driving elements, such as transistors, capacitors and lines, for driving the display elements can be disposed in the display area A/A.

Each of the plurality of pixels can include a plurality of sub-pixels SP that emits color light of different wavelengths, respectively. More specifically, the plurality of sub-pixels SP can include a first sub-pixel that emits light of a first color, a second sub-pixel that emits light of a second color and a third sub-pixel that emits light of a third color. For example, the first color can be red, the second color can be green, and the third color can be blue or white.

In some exemplary embodiments, the plurality of sub-pixels can be composed of first to third sub-pixels that emit light of first to third colors, respectively. Alternatively, the plurality of sub-pixels can be composed of first to fourth sub-pixels that emit light of first to fourth colors, respectively. If the plurality of sub-pixels is composed of four sub-pixels, for example, the first color can be red, the second color can be green, the third color can be blue and the fourth color can be white.

Some of the plurality of sub-pixels can have a tandem structure. Therefore, the light emitting display device 100 according to an exemplary embodiment of the present disclosure can reduce power consumption. Particularly, the light emitting display device 100 can improve a lifespan of a blue sub-pixel. A detailed structure of the plurality of sub-pixels will be described in more detail with reference to FIG. 1 through FIG. 8.

The non-display area N/A is an area where an image is not displayed and encloses the display area A/A. In an exemplary embodiment of the present disclosure, the non-display area N/A is illustrated in FIG. 1 and described as enclosing the display area A/A, but is not limited thereto. For example, the non-display area N/A can be an area extending from the display area A/A.

In the non-display area N/A, various components for driving the plurality of sub-pixels SP disposed in the display area A/A can be disposed. For example, a driving IC configured to supply a signal for driving the plurality of sub-pixels SP, a flexible film and the like can be disposed in the non-display area N/A.

Hereinafter, a structure of a pixel of the light emitting display device 100 according to an exemplary embodiment of the present disclosure will be described in more detail.

Figure 2:
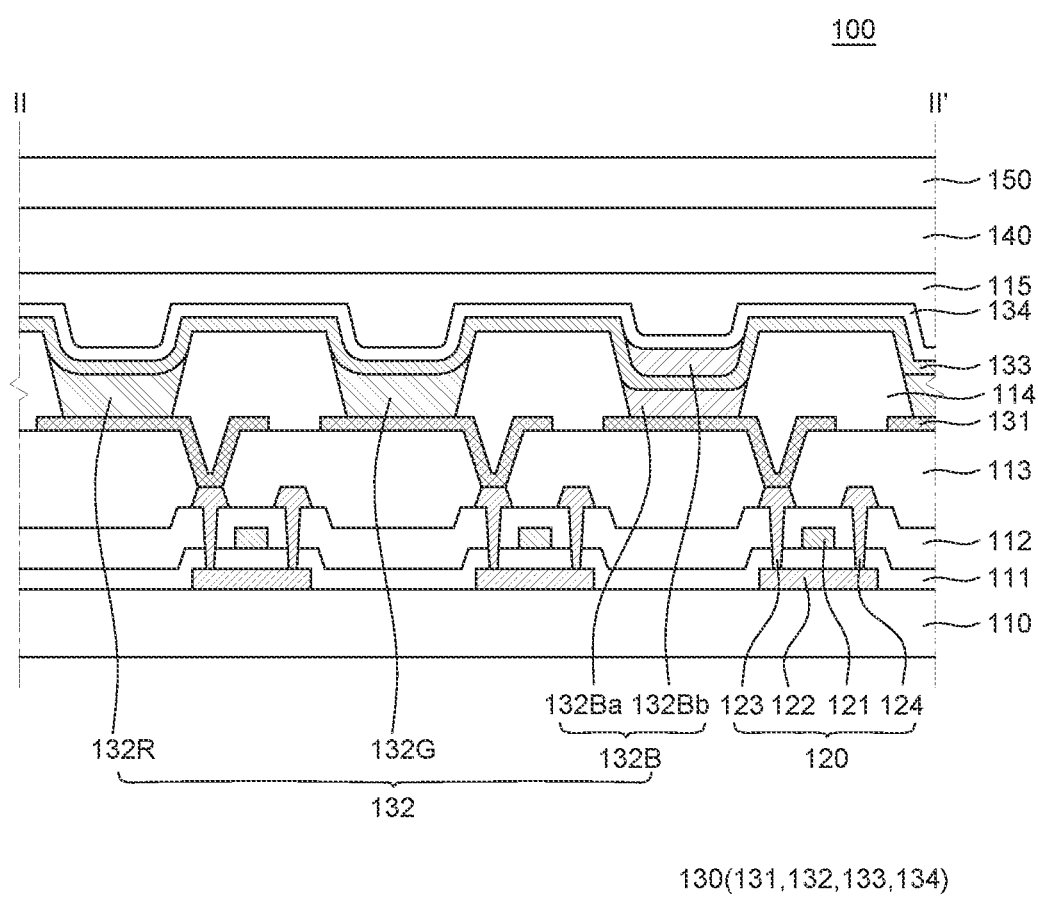
FIG. 2 is a cross-sectional view illustrating an example of a pixel shown in FIG. 1.
Figure 3:
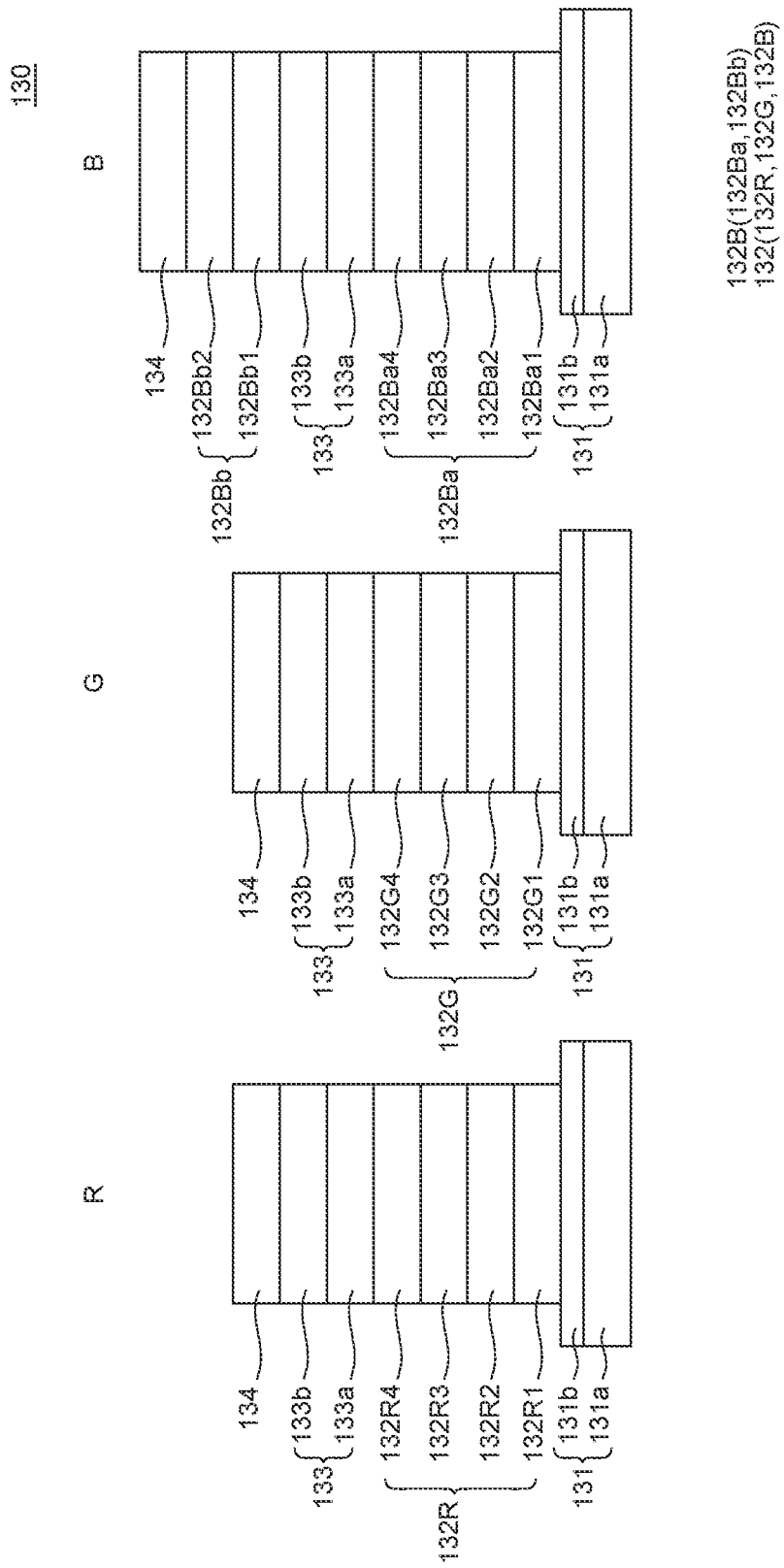
FIG. 3 is a cross-sectional view illustrating a light emitting diode of the pixel shown in FIG. 2.

FIG. 2 is a cross-sectional view illustrating an example of a pixel shown in FIG. 1. FIG. 3 is a cross-sectional view illustrating a light emitting diode of the pixel shown in FIG. 2.

Referring to FIG. 2 and FIG. 3, the pixel of the light emitting display device 100 according to an exemplary embodiment of the present disclosure includes a plurality of insulating layers 111, 112, 113, 114 and 115 on the substrate 110. Also, the pixel of the light emitting display device 100 according to an exemplary embodiment of the present disclosure includes a thin film transistor 120, a light emitting diode 130, an encapsulation layer 140 and a facing substrate 150.

First, referring to FIG. 2, the pixel of the light emitting display device 100 according to an exemplary embodiment of the present disclosure includes a gate insulating layer 111 on the substrate 110, a first insulating layer 112, a planarization layer 113, a bank 114 and a second insulating layer 115. Also, the pixel of the light emitting display device 100 according to an exemplary embodiment of the present disclosure includes the thin film transistor 120, the light emitting diode 130 and the encapsulation layer 140.

The thin film transistor 120 is disposed on the substrate 110. The thin film transistor 120 includes an active layer 121, a gate electrode 122, a source electrode 123 and a drain electrode 124. The thin film transistor 120 shown in FIG. 2 is a driving transistor and has a top gate thin film transistor in which the gate electrode 122 is disposed on the active layer 121. However, a structure of the thin film transistor 120 is not limited thereto. The thin film transistor 120 can be implemented as a bottom gate thin film transistor. In FIG. 2, a buffer layer can be formed between the substrate 110 and the gate insulating layer 111. The buffer layer can serve to enhance an adhesive force between layers formed on the substrate 110 and the substrate 110 and block alkali ions or the like flowing out from the substrate 110.

The active layer 121 of the thin film transistor 120 is disposed on the substrate 110. The active layer 121 is an area where a channel is formed when the thin film transistor 120 is driven. The active layer 121 can be made of an oxide semiconductor, amorphous silicon (a-Si), polycrystalline silicon (poly-Si) or an organic semiconductor.

The gate insulating layer 111 is disposed on the active layer 121. The gate insulating layer 111 can be formed as a single layer of silicon nitride (SiNx) or silicon oxide (SiOx) that is an inorganic material, or a multilayer of silicon nitride (SiNx) or silicon oxide (SiOx). In the gate insulating layer 111, contact holes through which the source electrode 123 and the drain electrode 124 are in contact with a source region and a drain region, respectively, of the active layer 121 are formed. The gate insulating layer 111 can be formed on the entire surface of the substrate 110 as shown in FIG. 2. Alternatively, the gate insulating layer 111 can be patterned to have the same width as the gate electrode 122, but is not limited thereto.

The gate electrode 122 is disposed on the gate insulating layer 111 so as to overlap with a channel region of the active layer 121. The gate electrode 122 can be one of various metal materials, for example, molybdenum (Mo), aluminum (Al), chromium (Cr), gold (Au), titanium (Ti), nickel (Ni), neodymium (Nd) and copper (Cu) or an alloy of two or more of them, or a multilayer thereof.

The first insulating layer 112 is disposed on the gate electrode 122. The first insulating layer 112 can be formed as a single layer of silicon nitride (SiNx) or silicon oxide (SiOx) or a multilayer of silicon nitride (SiNx) or silicon oxide (SiOx). In the first insulating layer 112, contact holes through which the source electrode 123 and the drain electrode 124 are in contact with the source region and the drain region, respectively, of the active layer 121 are formed.

The source electrode 123 and the drain electrode 124 are disposed on the first insulating layer 112. The source electrode 123 and the drain electrode 124 can be one of various metal materials, for example, molybdenum (Mo), aluminum (Al), chromium (Cr), gold (Au), titanium (Ti), nickel (Ni), neodymium (Nd) and copper (Cu) or an alloy of two or more of them, or a multilayer thereof.

The planarization layer 113 is disposed on the first insulating layer 112, the source electrode 123 and the drain electrode 124 to flatten an upper portion of the thin film transistor 120. A contact hole is formed in the planarization layer 113 to expose the source electrode 123 of the thin film transistor 120. Although FIG. 2 illustrates that a contact hole is formed in the planarization layer 113 to expose the source electrode 123, a contact hole can be formed to expose the drain electrode 124.

The planarization layer 113 can be made of one of acryl resin, epoxy resin, phenol resin, polyimide resin, polyamide resin, unsaturated polyester resin, polyphenylene resin, polyphenylene sulfide resin, benzocyclobutene and photoresist.

The light emitting diode 130 is disposed on the planarization layer 113. More specifically, the light emitting diode 130 includes a first electrode 131, an emission unit 132, a function improving unit 133 and a second electrode 134.

The first electrode 131 can be made of a conductive material having a high work function to supply holes to the emission unit 132. For example, the first electrode 131 can be made of transparent conductive oxide such as indium tin oxide (ITO), indium zinc oxide (IZO), indium tin zinc oxide (ITZO), zinc oxide (ZnO) and tin oxide (TO). The light emitting display device 100 according to an exemplary embodiment of the present disclosure is a top emission type display device. Thus, referring to FIG. 3, the first electrode 131 can include a reflective layer 131a that reflects light emitted from the emission unit 132 toward the second electrode 134 and a transparent conductive layer 131b that supplies holes to the emission unit 132, but is not limited thereto. The present disclosure is not limited to this exemplary embodiment. The first electrode 131 can include only the transparent conductive layer 131b and the reflective layer 131a can be a separate component from the first electrode 131.

The bank 114 is disposed on the first electrode 131. More specifically, the bank 114 is disposed at each boundary between sub-pixels SP. The bank 114 is a kind of partition wall and partitions off each sub-pixel to suppress mixing and output of light of specific colors output from adjacent sub-pixels. The bank 114 is formed through the display area of the substrate 110 except the sub-pixels SP. The first electrode 131 in each sub-pixel SP is exposed to the outside through an etched portion of the bank 114.

The bank 114 has hydrophobic properties. For example, the bank 114 can be made of an organic insulating material or an inorganic insulating material, and hydrophobic surface treatment can be performed onto a surface of the bank 114. For example, a mixed gas of a fluoride gas such as $CF_4$ or $C_2F_6$ and an Ar gas is converted into plasma and the surface of the bank 114 is treated with the generated plasma. Thus, a contact angle of the bank 114 is increased and the surface of the bank 114 can have hydrophobic properties. Also, the surface of the bank 114 can have hydrophobic properties by adding an additive such as a hydrophobic polymer to an organic insulating material for forming the bank 114.

The emission unit 132 is disposed on the first electrode 131 exposed between the banks 114. When a voltage is applied to the first electrode 131 serving as an anode and the second electrode 134 serving as a cathode, holes from the first electrode 131 and electrons from the second electrode 134 are injected to the emission unit 132. Thus, excitons are generated in the emission unit 132. As the excitons decay, light corresponding to an energy difference between lowest unoccupied molecular orbital (LUMO) and highest occupied molecular orbital (HOMO) of the emission layer can be generated and emitted to the outside.

The emission unit 132 is formed on the first electrode 131 through a solution process and thus has a U-shape which is thin at a central portion and thick at an edge portion. When the emission unit 132 is formed through a solution process, the emission unit 132 has a U-shape due to a difference in drying speed between the central portion and the edge portion during drying of ink. However, a shape of the emission unit 132 is not limited to the U-shape and can vary depending on solution process conditions, a composition of ink, characteristics of a surface applied with ink and the like. Since the emission unit 132 is formed on the first electrode 131, which is exposed without being covered by the bank 114, through a solution process, it can be disposed only inside the bank 114.

The emission unit 132 can be formed differently for each sub-pixel.

Referring to FIG. 3, an emission unit 132R of a first sub-pixel R that emits red light can be formed by sequentially laminating a hole injection layer 132R1, a hole transport layer 132R2, a red emission layer 132R3 and an electron transport layer 132R4. Herein, red is the first color.

An emission unit 132G of a second sub-pixel G that emits green light can be formed by sequentially laminating a hole injection layer 132G1, a hole transport layer 132G2, a green emission layer 132G3 and an electron transport layer 132G4. Herein, green is the second color.

Meanwhile, an emission unit 132B of a third sub-pixel B that emits blue light can be a tandem structure emission unit composed of a first emission unit 132Ba and a second emission unit 132Bb. More specifically, the emission unit 132B of the third sub-pixel B can be composed of the first emission unit 132Ba including a first hole injection layer 132Ba1, a first hole transport layer 132Ba2, a first blue emission layer 132Ba3 and an electron transport layer 132Ba4 and the second emission unit 132Bb including a second hole transport layer 132Bb1 and a second blue emission layer 132Bb2. Herein, blue is the third color.

The emission unit 132 of the light emitting display device 100 according to an exemplary embodiment of the present disclosure can have a microcavity structure. For example, the emission unit 132R of the first sub-pixel R can have the greatest height and the emission unit 132G of the second sub-pixel G can have a smaller height than the emission unit 132R of the first sub-pixel R and a greater height than the first emission unit 132Ba of the third sub-pixel B. Also, the first emission unit 132Ba of the third sub-pixel B can have a smaller height than the emission unit 132R of the first sub-pixel R and the emission unit 132G of the second sub-pixel G.

The function improving unit 133 is disposed on the emission unit 132. More specifically, the function improving unit 133 can be formed along upper portions of the emission unit 132R of the first sub-pixel R, the emission unit 132G of the second sub-pixel G, the first emission unit 132Ba of the third sub-pixel B and the bank 114. The function improving unit 133 can be made of a material having resistance and barrier properties to a solvent for the second emission unit 132Bb when the second emission unit 132Bb is formed in the third sub-pixel B.

The function improving unit 133 is formed on the emission unit 132 through a deposition process. However, the function improving unit 133 is disposed not only inside the bank 114 like the emission unit 132. Since a deposition process is performed onto the entire surface of the substrate 110, the function improving unit 133 can be disposed on a side surface and an upper surface of the bank 114. For example, referring to FIG. 2, the function improving unit 133 can be disposed to continuously cover the emission unit 132 and the bank 114.

The function improving unit 133 can include a first functional layer 133a and a second functional layer 133b.

The first functional layer 133a and the second functional layer 133b can interact with each other through diffusion or oxidation-reduction. The interaction, for example, oxidation-reduction, can lower an energy barrier between them.

The first functional layer 133a serves to inject electrons to each of the emission units 132R, 132G and 132B of the sub-pixels R, G and B. Thus, the first functional layer 133a needs to be disposed adjacent to the emission units 132R, 132G and 132B of the sub-pixels R, G and B. Therefore, the first functional layer 133a can be formed along the upper portions of the emission unit 132R of the first sub-pixel R, the emission unit 132G of the second sub-pixel G, the first emission unit 132Ba of the third sub-pixel B and the bank 114.

During the interaction through diffusion, the first functional layer 133a can include at least one layer of metallic oxide nano particles or a polar polymer. In this case, the metallic oxide nano particles can be made of any one of zinc (Zn), titanium (Ti), zirconium (Zr) and tin (Sn) or oxides of these metals. Also, the metallic oxide nano particles can be made of any one of the metallic oxides doped with alkali metal/alkali earth metal. The polar polymer can be made of a polyethylenimine (PEI) derivative electron injection material.

Meanwhile, during the interaction through oxidation-reduction, the first functional layer 133a can be made of oxides of metals including zinc (Zn), titanium (Ti), zirconium (Zr) and tin (Sn) or the metallic oxides doped with alkali metal and alkali earth metal.

The second functional layer 133b is disposed on the first functional layer 133a. Also, like the first functional layer 133a, the second functional layer 133b can be formed along the upper portions of the emission unit 132R of the first sub-pixel R, the emission unit 132G of the second sub-pixel G, the first emission unit 132Ba of the third sub-pixel B and the bank 114.

During the interaction through diffusion, the second functional layer 133b can include at least one layer of a conductive polymer. The conductive polymer can be made of one of polythiophene derivatives, polyaniline derivatives and polyarylamine derivatives, n-type or p-type semiconductors doped with them, oxides of metals including silver (Ag), molybdenum (Mo), chromium (Cr), vanadium (V), tungsten (W), nickel (Ni), copper (Cu) and iridium (Ir), or applicable materials serving as an electron acceptor.

Meanwhile, during the interaction through oxidation-reduction, the second functional layer 133b can be made of any one metallic oxide of silver (Ag), molybdenum (Mo), chromium (Cr), vanadium (V), tungsten (W), nickel (Ni), copper (Cu) and iridium (Ir).

The first functional layer 133a and the second functional layer 133b of the function improving unit 133 can be formed by sputtering and can provide ohmic properties. For example, the function improving unit 133 in the first sub-pixel R and the second sub-pixel G can provide ohmic properties.

The function improving unit 133 can serve as a charge generation layer CGL by combination with the second hole transport layer 132Bb1 of the second emission unit 132Bb of the third sub-pixel B. In this case, as described above, the second emission unit 132Bb of the third sub-pixel B is formed through a solution process and thus has a U-shape which is thin at a central portion and thick at an edge portion. However, the first emission unit 132Ba of the third sub-pixel B is formed inside the bank 114 through a solution process and the function improving unit 133 is disposed on the first emission unit 132Ba through a deposition process. Therefore, the second emission unit 132Bb can be disposed on the function improving unit 133. The second emission unit 132Bb is also formed through a solution process and thus can be disposed only inside the bank 114.

Therefore, the function improving unit 133 in the third sub-pixel B can provide HTL-n bonding properties by combination with the second hole transport layer 132Bb1. In this case, the second hole transport layer 132Bb1 needs to have a LUMO level close to a LUMO level of the second functional layer 133b. Therefore, the second hole transport layer 132Bb1 can be made of a high molecular hole transporting material capable of being applied and forming a film with a small difference in LUMO energy level from the second functional layer 133b such as TFB, PVK and PTPA. Alternatively, the second hole transport layer 132Bb1 can be made of a low molecular hole transporting material capable of being applied and forming a film with a small difference in LUMO energy level from the second functional layer 133b such as TCTA, NPB and a-NPD.

The second electrode 134 serving as a cathode is disposed on the emission unit 132R of the first sub-pixel R, the emission unit 132G of the second sub-pixel G, the second emission unit 132Bb of the third sub-pixel B and the bank 114. The second electrode 134 serves to supply electrons to each of the emission units 132R, 132G, 132Ba and 132Bb of the sub-pixels R, G and B. The second electrode 134 can be made of transparent conductive oxide based on indium tin oxide (ITO), indium zinc oxide (IZO), indium tin zinc oxide (ITZO), zinc oxide (ZnO) and tin oxide (TO) or an ytterbium (Yb) alloy. Alternatively, the second electrode 134 can be made of a metallic material having a very small thickness.

As described above, in the light emitting display device 100 according to an exemplary embodiment of the present disclosure, the function improving unit 133 is formed on the entire surface of the sub-pixels R, G and B and only the third sub-pixel B that emits blue light has a tandem structure. Thus, a lifespan of the third sub-pixel B can be improved.

Since only the third sub-pixel B that emits blue light has a tandem structure in the light emitting display device 100, the structure of the bank 114 that defines the third sub-pixel B can be changed.

Figure 4:
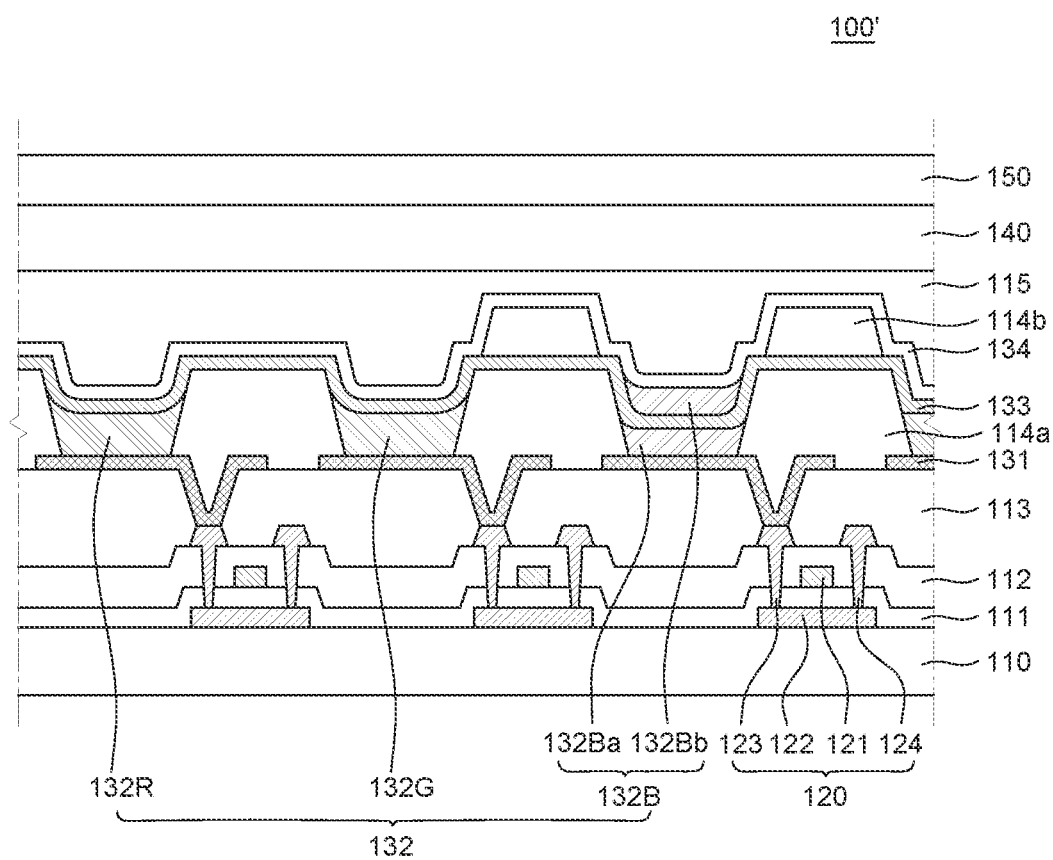
FIG. 4 is a cross-sectional view illustrating another example of the pixel shown in FIG. 1.

FIG. 4 is a cross-sectional view illustrating another example of the pixel shown in FIG. 1. FIG. 5A through FIG. 5E are cross-sectional views sequentially illustrating a process of manufacturing a light emitting diode of the pixel shown in FIG. 4.

First, referring to FIG. 4, a light emitting display device shown in FIG. 4 is the same as the light emitting display device shown in FIG. 2 except a bank that defines the emission units 132Ba and 132Bb of the third sub-pixel B is composed of a first bank layer 114a and a second bank layer 114b.

In this case, the first bank layer 114a has the same height as a bank that defines an emission areas of the first sub-pixel R and the second sub-pixel G. Also, the second bank layer 114b can be disposed on the first bank layer 114a. The first bank layer 114a and the second bank layer 114b have hydrophobic properties. For example, the first bank layer 114a and the second bank layer 114b can be made of an organic insulating material or an inorganic insulating material, and hydrophobic surface treatment can be performed onto surfaces thereof. For example, a mixed gas of a fluoride gas such as $CF_4$ or $C_2F_6$ and an Ar gas is converted into plasma and the surfaces of the first bank layer 114a and the second bank layer 114b are treated with the generated plasma. Thus, contact angles of the first bank layer 114a and the second bank layer 114b are increased and the surfaces of the first bank layer 114a and the second bank layer 114b can have hydrophobic properties. Also, the surfaces of the first bank layer 114a and the second bank layer 114b can have hydrophobic properties by adding an additive such as a hydrophobic polymer to an organic insulating material for forming the bank 114.

Figure 5A:
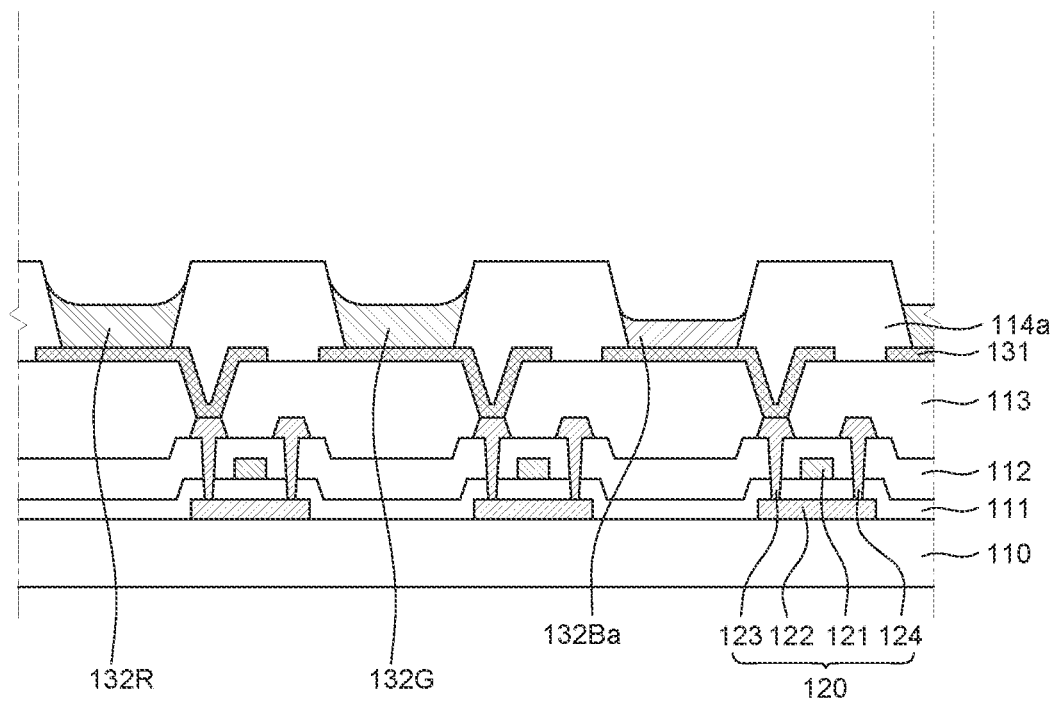
FIG. 5A through FIG. 5E are cross-sectional views sequentially illustrating a process of manufacturing a light emitting diode of the pixel shown in FIG. 4.

The light emitting diode 130 of a pixel can be formed as follows. First, as shown in FIG. 5A, the first electrode 131 is formed for each of the sub-pixels R, G and B on the substrate 110 on which the thin film transistor 120 and the planarization layer 113 are formed. Then, a bank, i.e., the first bank layer 114a, that defines an emission area of each of the sub-pixels R, G and B is formed. Thereafter, the emission unit 132R of the first sub-pixel R, the emission unit 132G of the second sub-pixel G and the first emission unit 132Ba of the third sub-pixel B are formed in the emission area of each of the sub-pixels R, G and B defined by the first bank layer 114a.

Figure 5B:
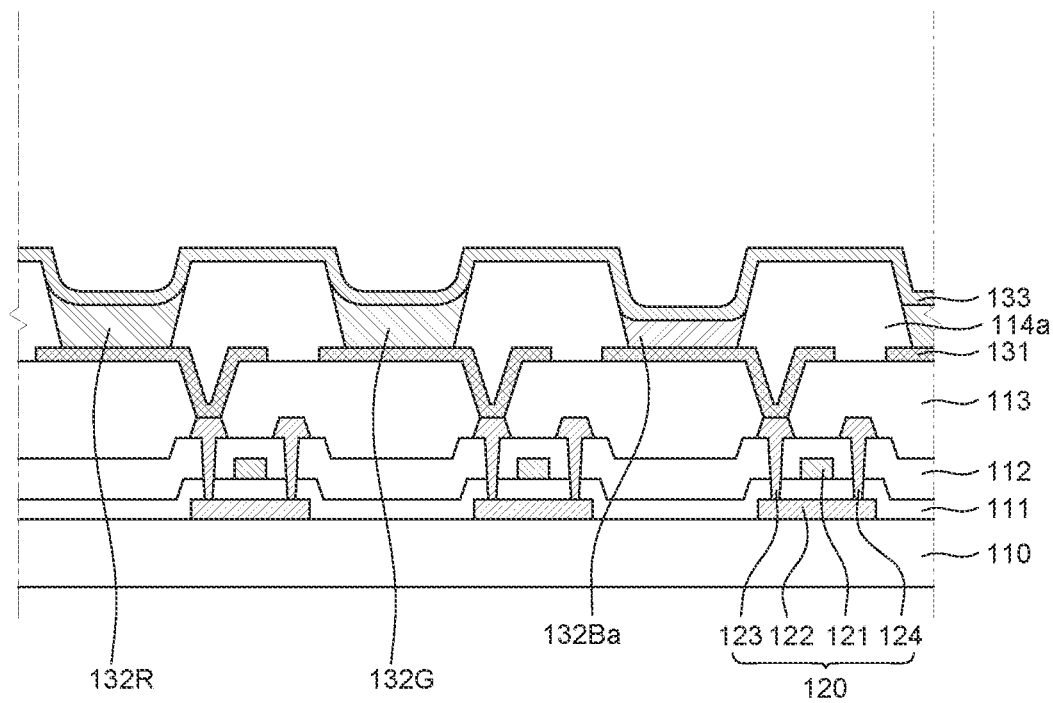

Then, as shown in FIG. 5B, the function improving unit 133 is formed on the emission unit 132R of the first sub-pixel R, the emission unit 132G of the second sub-pixel G, the first emission unit 132Ba of the third sub-pixel B and the first bank layer 114a. Here, the function improving unit 133 can be formed by sputtering.

Figure 5C:
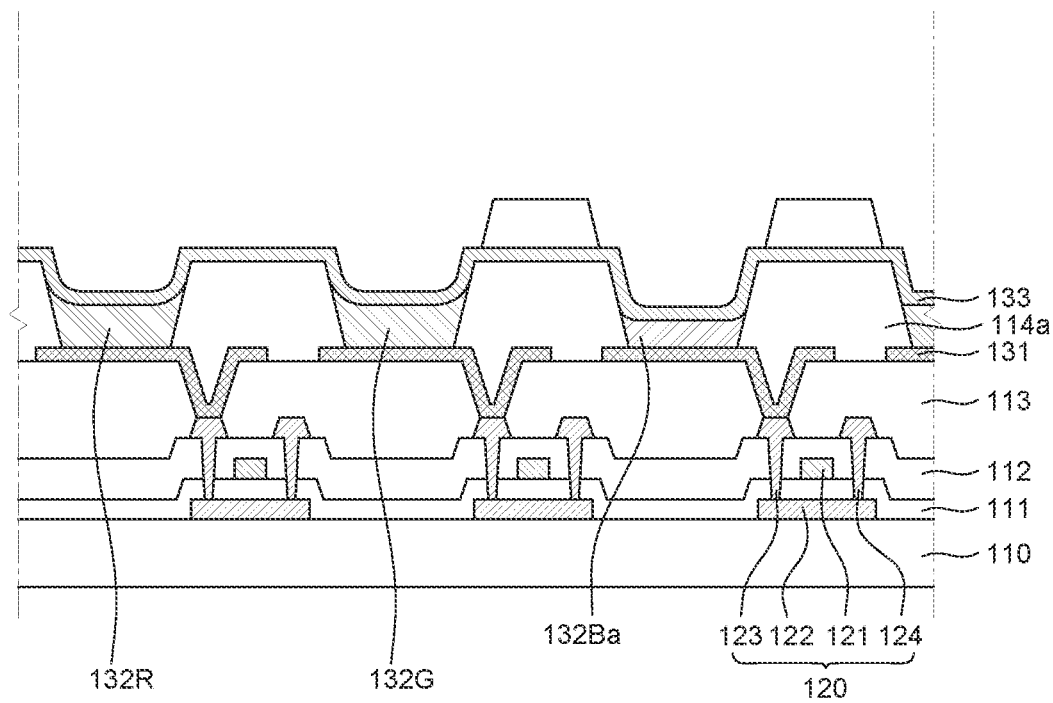

Thereafter, as shown in FIG. 5C, the second bank layer 114b is formed on the first bank layer 114a that defines the third sub-pixel B. Here, hydrophobic surface treatment can be performed onto a surface of the second bank layer 114b. In this case, a mixed gas of a fluoride gas such as $CF_4$ or $C_2F_6$ and an Ar gas can be converted into plasma and hydrophobic surface treatment can be performed onto the surface of the second bank layer 114b with the generated plasma.

Figure 5D:
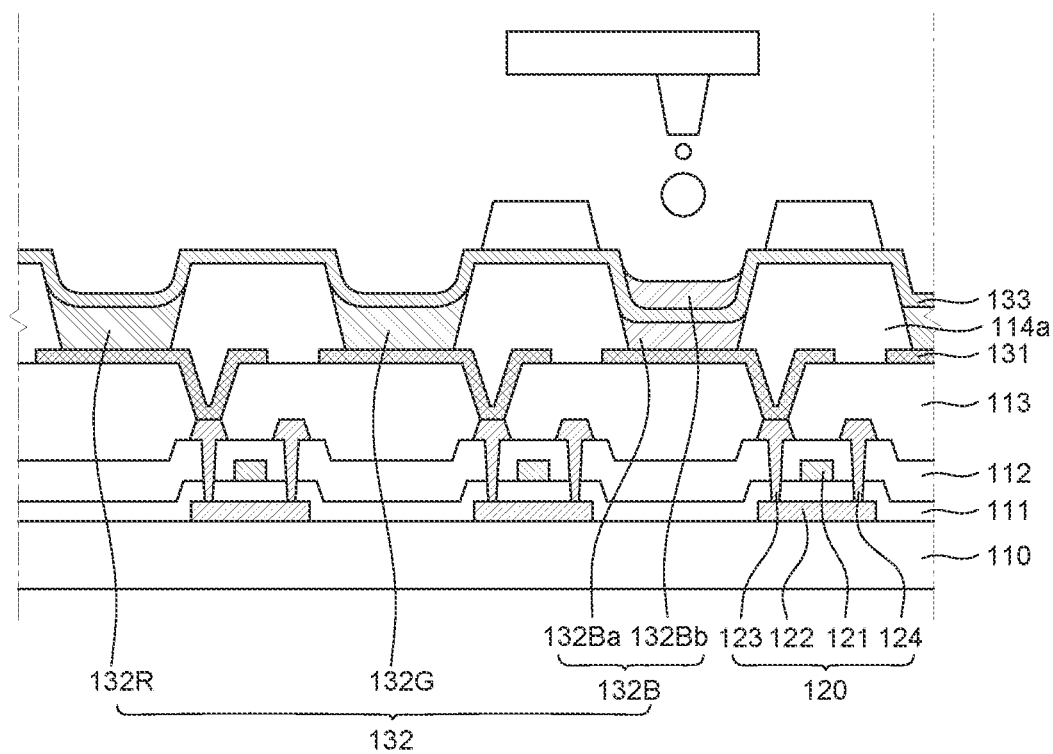

Then, as shown in FIG. 5D, the second emission unit 132Bb is formed in the emission area of the third sub-pixel B. In this case, the second emission unit 132Bb can be formed only in the emission area of the third sub-pixel B through a solution process.

To improve a lifespan of a sub-pixel that emits blue light in a general light emitting display device, a red sub-pixel, a green sub-pixel and a first emission part of a blue sub-pixel are formed first. Then, a charge generation layer CGL is formed only in the blue sub-pixel using a fine metal mask and a blue organic material is formed on the red sub-pixel R, the green sub-pixel G and the first emission unit of the blue sub-pixel B. In this general light emitting display device, the charge generation layer CGL is formed only in the blue sub-pixel B, and, thus, the blue organic material formed on the red sub-pixel R and the green sub-pixel G does not emit light.

However, the fine metal mask used for forming the charge generation layer CGL only in the blue sub-pixel B is not suitable for large-area application. Also, the blue organic material formed on the red sub-pixel R and the green sub-pixel G causes an increase in driving voltage of the device.

Accordingly, in the present disclosure, the charge generation layer CGL is formed on the entire surface of the substrate 110, rather than only in the third sub-pixel B that emits blue light. Also, the second emission unit 132Bb is formed only in the blue sub-pixel B through a solution process instead of a fine metal mask process. Thus, it is possible to improve a lifespan of a sub-pixel that emits blue light and also possible to reduce manufacturing costs.

Figure 5E:
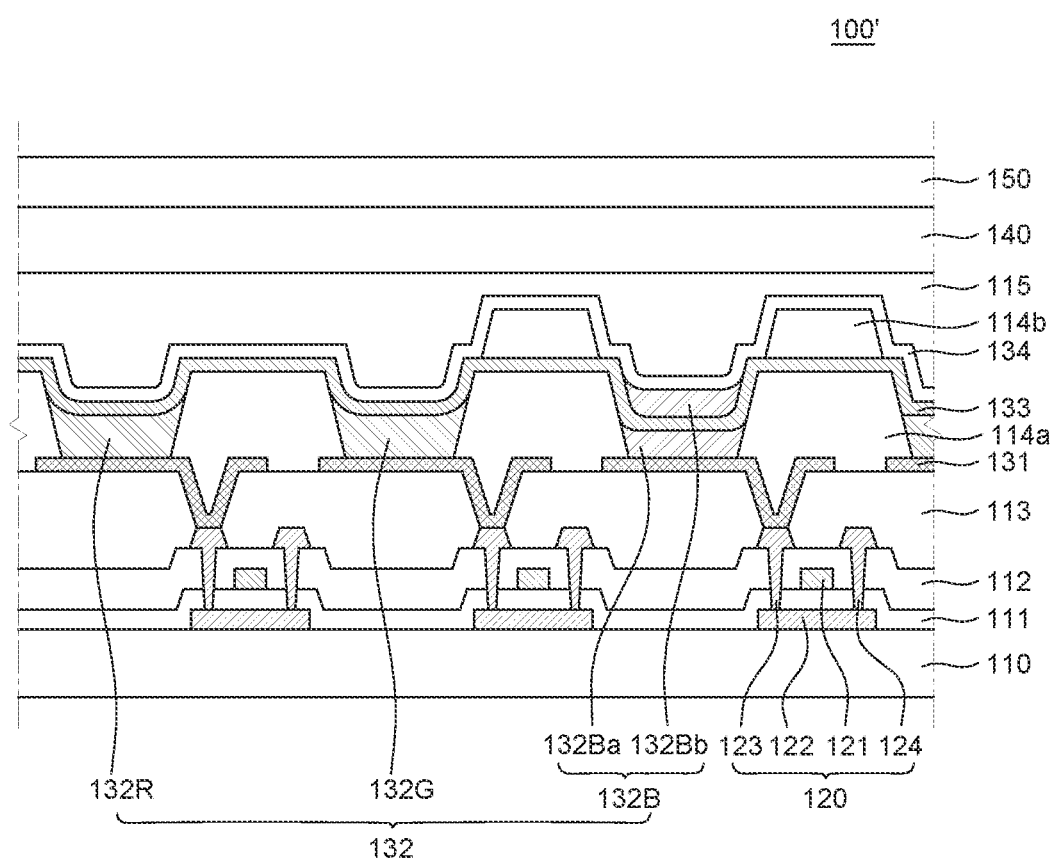

Then, as shown in FIG. 5E, the second electrode 134 is formed on the function improving unit 133 in the first sub-pixel R and the second sub-pixel G, the second emission unit 132Bb of the third sub-pixel B, the first bank layer 114*a* and the second bank layer 114*b*. Thus, the light emitting diode 130 of the light emitting display device according to the present disclosure is formed.

Although it has been described above that the light emitting display device emits light of three colors, for example, red, green and blue, it can emit light of four colors, for example, red, green, blue and white. Hereinafter, an example where the features of the present disclosure are applied to a structure of a light emitting display device that emits light of four colors will be described.

Figure 6:
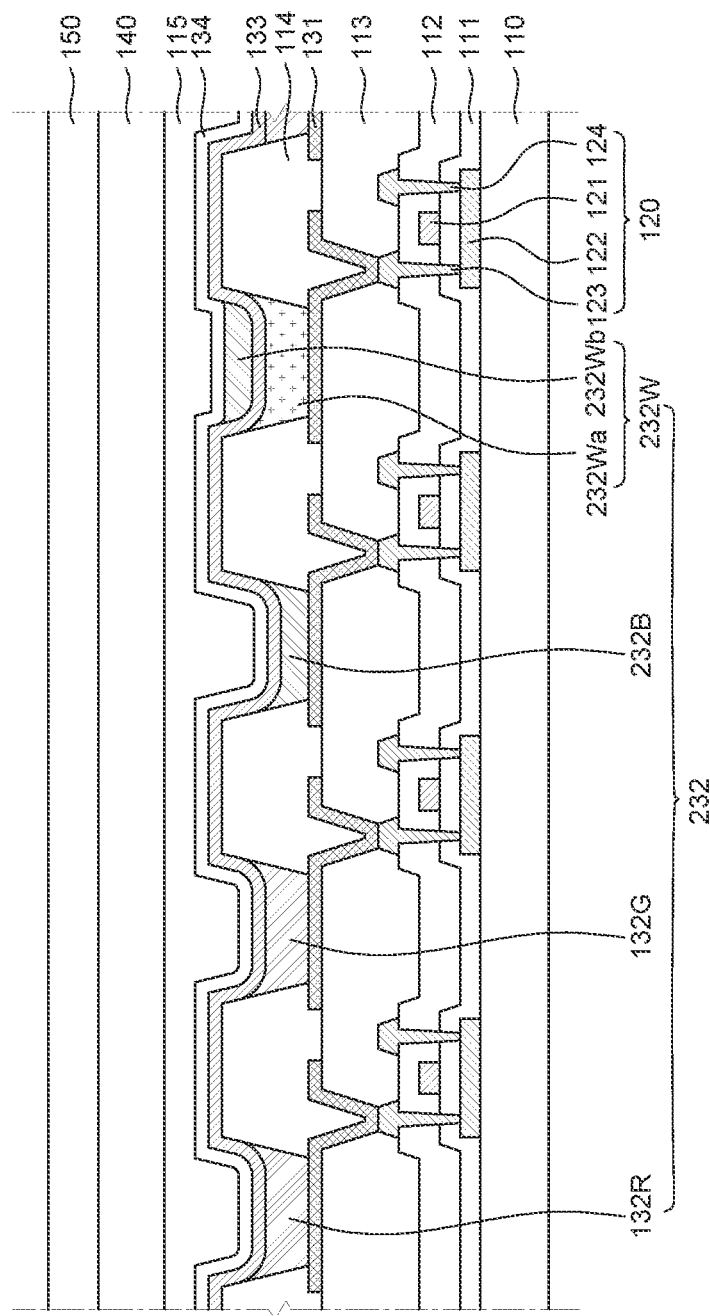
FIG. 6 is a cross-sectional view illustrating yet another example of the pixel shown in FIG. 1.
Figure 7:
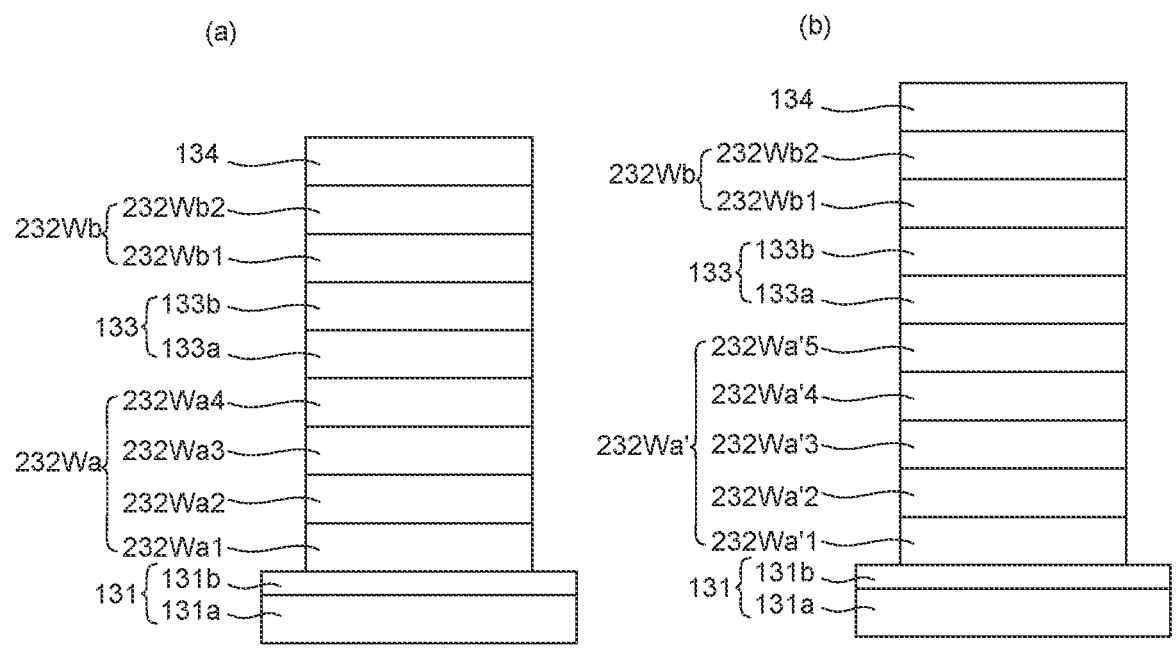
FIG. 7 is a cross-sectional view illustrating a light emitting diode of the pixel shown in FIG. 6.

FIG. 6 is a cross-sectional view illustrating yet another example of the pixel shown in FIG. 1. FIG. 7 is a cross-sectional view illustrating a light emitting diode of the pixel shown in FIG. 6.

Referring to FIG. 6, a light emitting display device 200 according to another exemplary embodiment of the present disclosure includes a first sub-pixel that emits light of a first color, a second sub-pixel that emits light of a second color, a third sub-pixel that emits light of a third color and a fourth sub-pixel that emits light of a fourth color. For example, the first color can be red, the second color can be green, the third color can be blue, and the fourth color can be white. In the light emitting display device 200, emission units 132R, 132G and 232B or a first emission unit 232Wa of the first to fourth sub-pixels, respectively, can be configured to implement a microcavity with different heights to improve luminous efficiency. For example, the emission unit 132R of the first sub-pixel that emits red light can have the greatest height and the emission unit 232B of the third sub-pixel that emits blue light can have the smallest height.

The emission units 132R and 132G of the first sub-pixel and the second sub-pixel can be formed by sequentially laminating a hole injection layer, a hole transport layer, emission layers that emit light of the first color and the second color, respectively, and an electron transport layer on the first electrode 131 as described above with reference to FIG. 2 and FIG. 3.

Meanwhile, the emission unit 232B of the third sub-pixel that emits blue light does not have a tandem structure unlike being illustrated in FIG. 2 and FIG. 3. The emission unit 232B of the third sub-pixel can be formed in the same manner as the emission units 132R and 132G of the first sub-pixel and the second sub-pixel. For example, the emission unit 232B of the third sub-pixel can also be formed by sequentially laminating a hole injection layer, a hole transport layer, a blue emission layer and an electron transport layer on the first electrode 131. Herein, blue is the third color.

An emission unit 232W of the fourth sub-pixel that emits white light can have a tandem structure composed of a first white emission unit 232Wa and a second white emission unit 232Wb. Herein, white is the fourth color.

The structure of the emission unit 232W of the fourth sub-pixel will be described in more detail with reference to FIG. 7. The emission unit 232W of the fourth sub-pixel that emits white light can be composed of the first white emission unit 232Wa and the second white emission unit 232Wb. In this case, the first white emission unit 232Wa can include a first hole injection layer 232Wa1, a first hole transport layer 232Wa2, a first emission layer 232Wa3 for emitting light of the fourth color and an electron transport layer 232Wa4. The second white emission unit 232Wb can include a second hole transport layer 232Wb1 and a second emission layer 232Wb2 for emitting light of the fourth color. The first emission layer 232Wa3 of the first white emission unit 232Wa and the second emission layer 232Wb2 of the second white emission unit 232Wb can emit light of different colors.

More specifically, as shown in (a) of FIG. 7, the first emission layer 232Wa3 of the first white emission unit 232Wa can emit yellow light and the second emission layer 232Wb2 of the second white emission unit 232Wb can emit blue light. In this case, the first white emission unit 232Wa can be formed to have a greater height than the second white emission unit 232Wb. FIG. 6 and FIG. 7 illustrate that the first emission layer 232Wa3 of the first white emission unit 232Wa emits yellow light and the second emission layer 232Wb2 of the second white emission unit 232Wb emits blue light, and vice versa.

The first white emission unit 232Wa and the second white emission unit 232Wb of the fourth sub-pixel are not limited thereto. As shown in (b) of FIG. 7, first emission layers 232Wa'3 and 232Wa'4 of a first white emission unit 232Wa' can be formed by laminating a red organic material and a green organic material and can emit light of a mixed color of red and green. The second emission layer 232Wb2 of the second white emission unit 232Wb can be a layer that emits blue light. In this case, the second white emission unit 232Wb of the fourth sub-pixel can be formed through a solution process.

The function improving unit 133 is disposed on the emission units 132R, 132G, 232B, 232Wa and 232Wb of the respective sub-pixels. More specifically, the function improving unit 133 can be formed along upper portions of the emission unit 132R of the first sub-pixel R, the emission unit 132G of the second sub-pixel G, the emission unit 232B of the third sub-pixel B, the first emission unit 232Wa of the fourth sub-pixel and the bank 114. The function improving unit 133 can be made of a material having resistance and barrier properties to a solvent for the second white emission unit 232Wb when the second white emission unit 232Wb is formed in the fourth sub-pixel. The function improving unit 133 can include the first functional layer 133a and the second functional layer 133b. The function improving unit 133 is the same as described above with reference to FIG. 2 and FIG. 3. Therefore, a detailed description thereof will be omitted or may be briefly discussed. In other words, the function improving unit 133 can be disposed between the first white emission unit 232Wa and the second white emission unit 232Wb in the fourth sub-pixel.

The second electrode 134 serving as a cathode is disposed on the emission unit 132R of the first sub-pixel R, the emission unit 132G of the second sub-pixel G, the emission unit 232B of the third sub-pixel B, the second emission unit 232Wb of the fourth sub-pixel and the bank 114. Thus, a light emitting diode of the light emitting display device 200 according to another exemplary embodiment of the present disclosure is completed.

To improve efficiency of a sub-pixel that emits blue light and power consumption of a sub-pixel that emits white light in a general light emitting display device that emits light of four colors, a red sub-pixel, a green sub-pixel, a blue sub-pixel and a first emission unit of a white sub-pixel are formed first. Then, a charge generation layer CGL is formed on the entire surface of the sub-pixels of four colors and a blue organic material is formed on the red sub-pixel R, the green sub-pixel G, the blue sub-pixel B and the first emission unit of the white sub-pixel W.

However, in this general structure, a color filter is needed due to the blue organic material formed on the sub-pixels. Also, the blue organic material is formed in the red and green sub-pixels as well as in the white sub-pixel, which causes a loss of power consumption.

To solve or address this limitation, in the light emitting display device 200 according to another exemplary embodiment of the present disclosure, the function improving unit is formed on each of the sub-pixels. Also, only the emission unit 232Wa of the sub-pixel that emits white light is configured to have a tandem structure. Therefore, it is possible to improve power consumption of the white sub-pixel without a color filter. Herein, white is the fourth color.

Meanwhile, in the light emitting display device that emits light of four colors, the third sub-pixel that emits blue light can also have a tandem structure to improve a lifespan of a sub-pixel that emits blue light.

Figure 8:
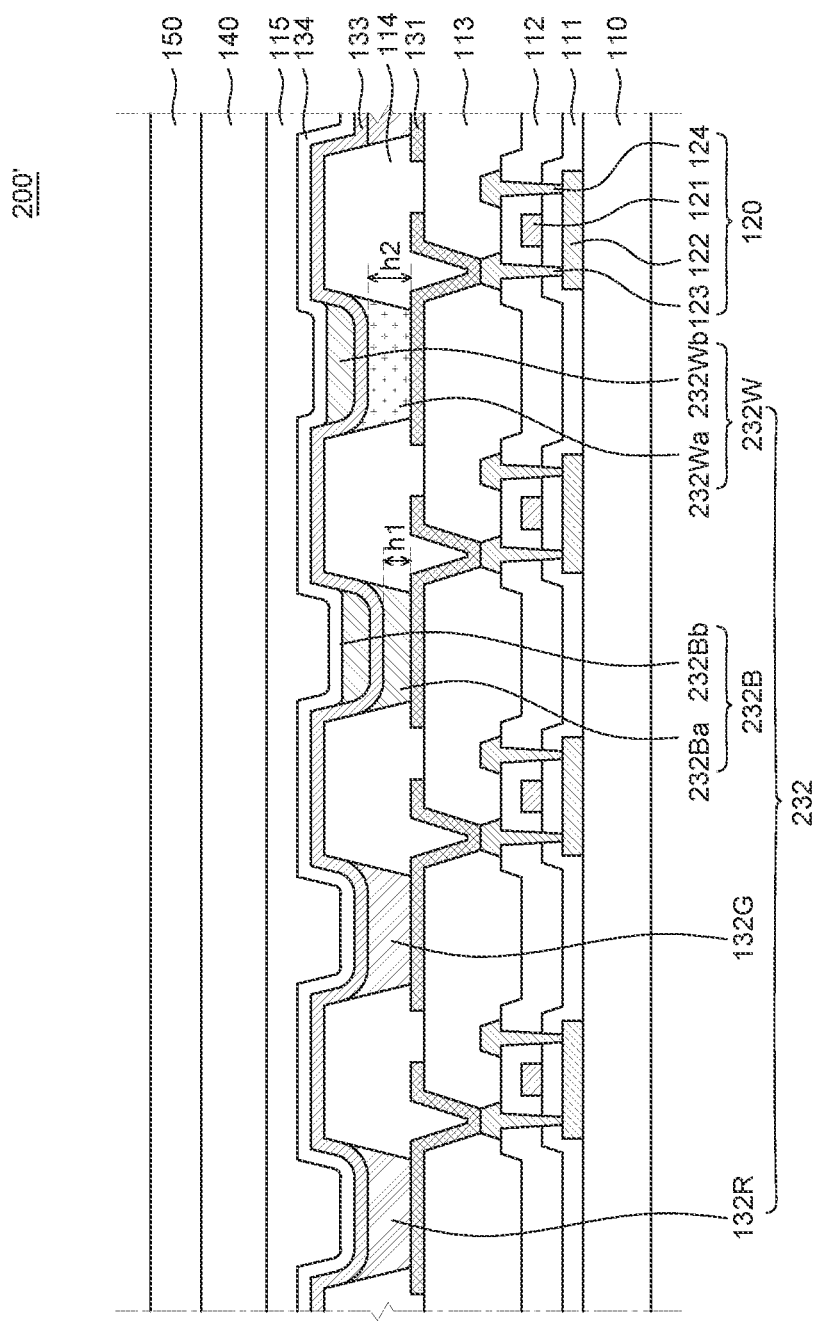
FIG. 8 is a cross-sectional view illustrating still another example of the pixel shown in FIG. 1.

FIG. 8 is a cross-sectional view illustrating still another example of the pixel shown in FIG. 1.

Referring to FIG. 8, a light emitting display device 200' according to yet another exemplary embodiment of the present disclosure includes a first sub-pixel that emits light of a first color, a second sub-pixel that emits light of a second color, a third sub-pixel that emits light of a third color and a fourth sub-pixel that emits light of a fourth color. Each of the third sub-pixel and the fourth sub-pixel can have a tandem structure.

The third sub-pixel can serve as a sub-pixel that emits blue light, and an emission unit of the third sub-pixel can be composed of a first blue emission unit 232Ba and a second blue emission unit 232Bb. The structure in which the third sub-pixel that emits blue light has a tandem structure and the function improving unit 133 is disposed between the first blue emission unit 232Ba and the second blue emission unit 232Bb is the same as described above with reference to FIG. 2 and FIG. 3. Therefore, a detailed description thereof will be omitted or may be briefly discussed.

The fourth sub-pixel can serve as a sub-pixel that emits white light, and an emission unit of the fourth sub-pixel can be composed of the first white emission unit 232Wa and the second white emission unit 232Wb. The structure in which the fourth sub-pixel that emits white light has a tandem structure and the function improving unit 133 is disposed between the first white emission unit 232Wa and the second white emission unit 232Wb is the same as described above with reference to FIG. 6 and FIG. 7. Therefore, a detailed description thereof will be omitted. In this case, if an emission layer of the first white emission unit 232Wa is configured to emit yellow light, a height h1 of the emission layer can be greater than a height h2 of an emission layer of the first blue emission unit 232Ba.

In other words, the light emitting display device 200' according to yet another exemplary embodiment of the present disclosure can have a microcavity structure in which an emission layer of the first sub-pixel that emits red light has the greatest height and an emission of the first blue emission layer 232Ba of the third sub-pixel that emits blue light has the smallest height. If the emission layer of the first white emission unit 232Wa of the fourth sub-pixel that emits white light emits yellow light, it can have a greater height than the emission layer that emits blue light.

As described above, in the light emitting display device 200' according to yet another exemplary embodiment of the present disclosure, the function improving unit 133 is formed on the first sub-pixel that emits red light, the second sub-pixel that emits green light, the third sub-pixel that emits blue light and the fourth sub-pixel that emits white light. Also, only the third sub-pixel and the fourth sub-pixel are configured to have a tandem structure. Therefore, it is possible to improve a lifespan of the third sub-pixel and power consumption efficiency of the fourth sub-pixel. Herein, red is the first color, green is the second color, blue is the third color and white is the fourth color.

The exemplary embodiments of the present disclosure can also be described as follows:

According to an aspect of the present disclosure, a light emitting display device, can include a substrate; a light emitting diode disposed on the substrate and having a first sub-pixel including a first emission part that emits light of a first color, a second sub-pixel including a second emission part that emits light of a second color, a third sub-pixel including a third emission part that emits light of a third color and a fourth sub-pixel including a fourth emission part that emits light of a fourth color; a bank that defines a pixel area of each of the first sub-pixel, the second sub-pixel, the third sub-pixel and the fourth sub-pixel; and a function improving unit disposed on the first emission part, the second emission part, the third emission part, the fourth emission part and the bank, wherein one or two of sub-pixel among the first to fourth sub-pixels include a tandem emission part in which a first emission unit including a first emission layer and a second emission unit disposed on the first emission unit and including a second emission part are laminated.

The function improving unit can be disposed on the first emission part, the second emission part, the first emission unit and the bank.

The function improving unit can be formed by laminating a first functional layer and a second functional layer that interact with each other through diffusion or oxidation-reduction.

When the first functional layer and the second functional layer interact with each other through diffusion, the first functional layer includes at least one layer of metallic oxide nano particles or a polar polymer, and the second functional layer can include at least one layer of a conductive polymer.

The metallic oxide nano particles of the first functional layer can be made of any one of zinc (Zn), titanium (Ti), zirconium (Zr) and tin (Sn) or oxides of these metals and any one of the metallic oxides doped with alkali metal/alkali earth metal, and the polar polymer is made of a polyethylenimine (PEI) derivative electron injection material.

The conductive polymer of the second functional layer can be made of one of polythiophene derivatives, polyaniline derivatives and polyarylamine derivatives, n-type or p-type semiconductors doped with them, oxides of metals including silver (Ag), molybdenum (Mo), chromium (Cr), vanadium (V), tungsten (W), nickel (Ni), copper (Cu) and iridium (Ir), or applicable materials serving as an electron acceptor.

When the first functional layer and the second functional layer interact with each other through oxidation-reduction, the first functional layer is made of oxides of metals including zinc (Zn), titanium (Ti), zirconium (Zr) and tin (Sn) or the metallic oxides doped with alkali metal and alkali earth metal, and the second functional layer can be made of any one metallic oxide of silver (Ag), molybdenum (Mo), chromium (Cr), vanadium (V), tungsten (W), nickel (Ni), copper (Cu) and iridium (Ir).

The first emission unit can be composed of a hole injection layer, a first hole transport layer, a first emission layer and an electron transport layer, and the second emission unit is composed of a second hole transport layer and a second emission layer.

The second emission unit can be prepared through a solution process.

The function improving unit can be disposed between the first emission unit and the second emission unit.

The second hole transport layer and the function improving unit can serve to generate charges.

Hydrophobic treatment can be performed onto a surface of the bank.

The bank that defines a sub-pixel including an emission unit having a tandem structure among the first to fourth sub-pixels is composed of at least two layers.

The bank can include a first bank layer and a second bank layer, and the first bank layer and the second bank layer have hydrophobic properties.

The function improving unit can be disposed between the first bank layer and the second bank layer.

Each of the first emission part, the second emission part and the first emission unit can have a different height from each other.

The sub-pixel having a tandem structure can emit white light or blue light.

Although the exemplary embodiments of the present disclosure have been described in detail with reference to the accompanying drawings, the present disclosure is not limited thereto and can be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A light emitting display device, comprising:
   a light emitting diode structure disposed on a substrate and having a first sub-pixel including a first emission part that emits light of a first color, a second sub-pixel including a second emission part that emits light of a second color, a third sub-pixel including a third emission part that emits light of a third color and a fourth sub-pixel including a fourth emission part that emits light of a fourth color;
   a bank that defines a pixel area of each of the first sub-pixel, the second sub-pixel, the third sub-pixel and the fourth sub-pixel; and
   a function improving unit disposed on the first emission part, the second emission part, the third emission part, the fourth emission part and the bank,
   wherein one or two of sub-pixel among the first to fourth sub-pixels include a tandem emission part in which a first emission unit including a first emission layer and a second emission unit disposed on the first emission unit and including a second emission part are laminated.

2. The light emitting display device according to claim 1, wherein the function improving unit is disposed on the first emission part, the second emission part, the first emission unit and the bank.

3. The light emitting display device according to claim 2, wherein the function improving unit is formed by laminating a first functional layer and a second functional layer that interact with each other through diffusion or oxidation-reduction.

4. The light emitting display device according to claim 3, wherein when the first functional layer and the second functional layer interact with each other through diffusion,
   the first functional layer includes at least one layer of metallic oxide nano particles or a polar polymer, and
   the second functional layer includes at least one layer of a conductive polymer.

5. The light emitting display device according to claim 4, wherein the metallic oxide nano particles of the first functional layer are made of any one of zinc (Zn), titanium (Ti), zirconium (Zr) and tin (Sn) or oxides of these metals and any one of the metallic oxides doped with alkali metal/alkali earth metal, and
   the polar polymer is made of a polyethylenimine (PEI) derivative electron injection material.

6. The light emitting display device according to claim 4, wherein the conductive polymer of the second functional layer is made of any one of polythiophene derivatives, polyaniline derivatives and polyarylamine derivatives, n-type or p-type semiconductors doped with them, oxides of metals including silver (Ag), molybdenum (Mo), chromium (Cr), vanadium (V), tungsten (W), nickel (Ni), copper (Cu) and iridium (Ir), or applicable materials serving as an electron acceptor.

7. The light emitting display device according to claim 3, wherein when the first functional layer and the second functional layer interact with each other through oxidation-reduction,
   the first functional layer is made of any one of oxides of metals including zinc (Zn), titanium (Ti), zirconium (Zr) and tin (Sn) or the metallic oxides doped with alkali metal and alkali earth metal, and
   the second functional layer is made of any one metallic oxide among silver (Ag), molybdenum (Mo), chromium (Cr), vanadium (V), tungsten (W), nickel (Ni), copper (Cu) and iridium (Ir).

8. The light emitting display device according to claim 1, wherein the first emission unit includes a hole injection layer, a first hole transport layer, a first emission layer and an electron transport layer, and the second emission unit includes a second hole transport layer and a second emission layer.

9. The light emitting display device according to claim 8, wherein the second emission unit is prepared through a solution process.

10. The light emitting display device according to claim 8, wherein the function improving unit is disposed between the first emission unit and the second emission unit.

11. The light emitting display device according to claim 10, wherein the second hole transport layer and the function improving unit serve to generate charges.

12. The light emitting display device according to claim 1, wherein hydrophobic treatment is performed onto a surface of the bank.

13. The light emitting display device according to claim 12, wherein the bank that defines a sub-pixel including an emission unit having a tandem structure among the first to fourth sub-pixels includes at least two layers.

14. The light emitting display device according to claim 13, wherein the bank includes a first bank layer and a second bank layer, and the first bank layer and the second bank layer have hydrophobic properties.

15. The light emitting display device according to claim 14, wherein the function improving unit is disposed between the first bank layer and the second bank layer.

16. The light emitting display device according to claim 1, wherein each of the first emission part, the second emission part and the first emission unit has a different height from each other.

17. The light emitting display device according to claim 1, wherein the sub-pixel having a tandem structure emits white light or blue light.

* * * * *